(12) United States Patent
Davis et al.

(10) Patent No.: US 6,190,517 B1
(45) Date of Patent: Feb. 20, 2001

(54) MAGNET ARRAY

(75) Inventors: Mervyn Howard Davis, Birdham; David Ian Charles Pearson, Hayling Island; Simon Richard Reeves, Warsash; Barry Diver, deceased, late of Sheffield, all of (GB), by Joan Mary Diver, legal representative

(73) Assignee: Nordiko Limited (GB)

( * ) Notice: Under 35 U.S.C. 154(b), the term of this patent shall be extended for 0 days.

(21) Appl. No.: 09/180,457

(22) PCT Filed: May 7, 1997

(86) PCT No.: PCT/GB97/01233

§ 371 Date: Feb. 22, 1999

§ 102(e) Date: Feb. 22, 1999

(87) PCT Pub. No.: WO97/42649

PCT Pub. Date: Nov. 13, 1997

(30) Foreign Application Priority Data

May 7, 1996  (GB) .................................................... 9609470

(51) Int. Cl.[7] .............................. H01J 37/34; H01F 7/20; C23C 14/34
(52) U.S. Cl. ................................ 204/298.16; 204/298.02; 204/298.06; 204/298.17; 204/298.18; 335/210; 335/213; 335/219; 335/296; 335/297; 335/299; 335/306
(58) Field of Search ...................... 204/298.02, 298.06, 204/298.16, 298.17, 298.18; 335/210, 213, 219, 296, 297, 299, 306

(56) References Cited

U.S. PATENT DOCUMENTS 5,512,150   4/1996   Bourez et al. ..................... 204/192.2
5,589,039 * 12/1996   Hsu ................................. 204/192.12

OTHER PUBLICATIONS

Patent Abstracts of Japan, abstract for JP 62–232911 A, Oct. 1987.

* cited by examiner

*Primary Examiner*—Alan Diamond
(74) *Attorney, Agent, or Firm*—Senniger, Powers, Leavitt & Roedel

(57) ABSTRACT

An electro-magnet array for use in a sputtering apparatus. The array has a magnetisable core member extending substantially horizontally and having magnetisable outward projections arranged as at least two pairs of symmetrically opposed projections projecting outwardly from the core member. A pole member is associated with each projection and vertically displaced with respect thereto. A magnetisable coupler is arranged to couple each pole piece magnetically to its respective projection. A magnetising coil around each projection is arranged for producing a magnetic field aligned substantially with a horizontal axis of symmetry of its respective projection in dependence upon the direction of flow of electric current through the magnetising coil. The magnetising coils are arranged so that, upon energisation, the magnetic field of one coil of a pair of projections can produce a south pole at an inward side of its respective pole piece while the magnetic field of the coil of the other projection of the pair produces a north pole at an inward side of its respective pole piece. At any moment, at least two inwardly facing south poles are produced on the pole pieces on one side of a vertical plane of symmetry through the array and an equal number of inwardly facing north poles are produced on the pole pieces on the other side of the vertical plane of symmetry.

38 Claims, 6 Drawing Sheets

MAGNET ARRAY

This invention relates to a magnet array for use in a sputtering apparatus.

Thin film recording heads are an important part of disc drives for use in computers. Current designs of disc drives tend to utilise an inductive "read" head and an inductive "write" head. However, emerging and future generations of high capacity disc drives will incorporate more sensitive "read" heads of a design which is known as a magneto-resistive (MR) head. The technology required to produce such heads is more advanced than that needed to produce inductive "read" and "write" heads.

Building each sensor for reading the magnetic encrypted information from the disc (or sometimes tape) requires the deposition of thin layers, typically from about 1 to about 30 nm thick, of magnetically oriented ferro-magnetic material upon a wafer of ceramic material, such as AlTiC. The deposition conditions to achieve this must be precisely controlled. Such thin layers are normally produced using sputtering techniques.

It is known to deposit the magnetic layers by sputtering under the influence of an orienting magnetic field. Historically this has been achieved by the use of permanent magnet tooling mounted within the vacuum chamber of the sputtering apparatus. More recently it has been proposed to use electro-magnets. It is also common practice to use an oscillating magnetic field applied in a single plane. This last mentioned technique applies the field first in one direction and then reverses the polarity so that the field is applied in the opposite direction at 180° to the first direction, before again reversing the field, and so forth.

New types of very sensitive sensors, known as spin-valves and GMR (giant magneto-resistive) sensors, promise higher performance. These structures require two magnetic layers, i.e. a pinned magnetic layer and a free magnetic layer. The pinned magnetic layer provides a fixed magnetic field, while the free layer is made from a soft magnetic material that has a high magnetic saturation and is readily magnetisable upon exposure to a magnetic field. The free layer has both a hard axis and an easy axis of magnetisation. Examples of suitable soft magnetic materials include Ni/Fe alloys, such as Permalloy™, cobalt alloys, and iron alloys. In a spin-valve MR sensor the pinned and free layers should have their magnetic axes orthogonal, that is to say the magnetic axis of the pinned magnetic layer should be at right angles to the easy axis of magnetisation of the free layer. Ideally the lines of force of the magnetic field in the plane of the film should, for each layer, be parallel across the layer. In practice it is impossible to produce with existing techniques such an ideal arrangement. Hence it is recognised that there is some departure from ideality. This can be expressed by a property known as "skew". This is the angle, normally expressed in degrees of arc, by which the magnetic field deviates from ideality.

It is difficult to design a form of magnet array to achieve the necessary accuracy of deposition of the free and pinned layers. If two separate sets of electro-magnets are used, the one being used during deposition of the first layer and the other being used during deposition of the second layer, the problem is that the core material of the one set perturbs the magnetic field produced by the other set and vice versa.

The present invention accordingly seeks to provide an improved magnet array for use in a sputtering apparatus for use in depositing magnetically oriented thin layers, particularly successive layers having different orientations of their magnetic axes. It further seeks to provide a magnet array that can produce at different times magnetic fields whose orientation can be precisely and accurately controlled at any given moment. The invention further seeks to provide a form of electro-magnet array which can be used in a sputtering apparatus to effect deposition of successive thin layers of magnetic material whose axes of magnetisation are substantially orthogonal to one another.

In this specification the terms "horizontal" and "vertical" are used for convenience only to designate directions within the magnet array. In use the magnet array of the invention may be mounted in a sputtering apparatus so that the internal "horizontal" direction of the array is not horizontal in a true sense and the internal "vertical" direction of the array is not truly vertical.

According to the present invention there is provided an electro-magnet array for use in a sputtering apparatus comprising:

a magnetisable core member extending substantially horizontally and having magnetisable outward projections arranged as at least two pairs of symmetrically opposed projections projecting outwardly and radially symmetrically from the magnetisable core piece;

a pole piece associated with each projection and vertically displaced with respect thereto;

magnetisable coupling means arranged to couple each pole piece magnetically to its respective projection; and a magnetising coil around each projection arranged for producing a magnetic field aligned substantially with a horizontal axis of symmetry of its respective projection in dependence upon the direction of flow of electric current through the magnetising coil;

the magnetising coils being arranged so that, upon energisation, the respective magnetic field of one coil of a pair of projections can produce a south pole at an inward side of its respective pole piece while the magnetic field of the coil of the other projection of the pair produces a north pole at an inward side of its respective pole piece and so that, at any moment, at least two inwardly facing south poles are produced on the pole pieces on one side of a vertical plane of symmetry through the array and an equal number of inwardly facing north poles are produced on the pole pieces on the other side of the vertical plane of symmetry, the vertical plane of symmetry passing between adjacent pole pieces.

In a preferred arrangement there are four magnetisable projections on the magnetisable core member arranged in two pairs. However, it is alternatively envisaged that there shall be six magnetisable projections arranged in three pairs or eight magnetisable projections arranged in four pairs. The magnetisable projections typically extend horizontally from the core member.

Preferably the magnetisable core member is formed from a plate and the projections are integral therewith. However, it is possible to attach separate projections to a central core magnetisable member. Other shapes of core member can be used other than a plate member, if desired.

In a preferred embodiment the core member is substantially square in outline and the projections are also substantially square or rectangular in outline so that the core member and its four projections form a cross.

If desired a central aperture can be formed in the magnetisable core member to allow passage of items for connection, for example, to the support for the wafer or other substrate, such as coolant supply lines, electrical connections and the like.

The magnetisable core member and its projections are preferably made from a soft magnetisable material, such as soft iron, mild steel, or a soft magnetic alloy.

The pole pieces are normally identical one to another and displaced by the same vertical distance from the magnetisable core member and its projections. Hence the pole pieces are preferably symmetrically disposed about a vertical axis of the core member.

The magnetisable coupling means preferably comprises a member or members of a soft magnetisable material, for example one of those mentioned above. The pole pieces are similarly made from a soft magnetic material.

Taking for the sake of simplicity a magnet array having a magnetisable member with four projections, it will be apparent that, if the current in one coil of an opposed pair and that in an adjacent coil of the other pair is caused to flow in a direction to produce a south pole at each of the respective radially inner faces of their pole pieces, and if the current in the other coils is in each case caused to flow in a direction so as to produce a north pole at each of the respective radially inner faces of their associated pole pieces, then a horizontal magnetic field will be produced which points generally from a gap between the first mentioned two pole pieces, with the south poles at their radially inner faces, to the corresponding gap between the third and fourth mentioned pole pieces, which have north poles at their radially inner faces. Then upon reversing the direction of flow of electric current through the first mentioned coil and the third mentioned coil, but maintaining the original direction of flow of electric current in the second and fourth mentioned coils, the magnetic polarities at the radially inner faces of the pole pieces associated with the first and third mentioned coils are reversed from their former polarities and a horizontal magnetic field pointing in a direction at right angles to that of the previously mentioned direction will be produced. Thus by maintaining the direction of flow of electric current in one opposed pair of coils but reversing the direction of flow of electric current in each of the other pair of coils, the direction of the magnetic field can be made to change by 90°. In each case it is important that there should be produced a number of south poles on the radially inner faces of the pole pieces on one side of a vertical plane of symmetry through the array and an equal number of north poles on the radially inner faces of the pole pieces on the other side of that vertical plane of symmetry. Since there are four pole pieces there are two vertical planes of symmetry that satisfy this criterion.

By reversing the directions of flow of current through the coils from those described in the preceding paragraph the magnetic field can be orientated in corresponding directions 180° from those previously described. Hence there are four possible modes of operation and by appropriate control of the directions of flow of electric current through the coils the magnetic field can be orientated in any of four different directions at 90° or 180° to one another.

It will be readily apparent to the skilled reader that the invention is not restricted to the use of four projections, coils and pole pieces and that any even number of projections, coils and pole pieces can be used. Thus, if there are six projections on the magnetisable core member as well as six coils and six pole pieces, then there are three vertical planes of symmetry that pass between adjacent pole pieces. Of the six coils, three on one side of one of these planes of symmetry can be operated with the current flowing so as to produce a south pole at each of the inner faces of their respective pole pieces and with the current flowing in the other three coils so that there are north poles at the inner faces of their respective pole pieces. Since there are three vertical planes of symmetry there are six possible modes of operation with three south poles on one side of the plane of symmetry and three north poles on the other side thereof. Each such mode of operation produces a horizontal magnetic field whose direction lies at 60°, 120° or 180° to the corresponding direction of the other modes of operation. Hence by appropriately switching the direction of flow of current through the coils the direction of the magnetic field can be switched to any of six directions at 60°, 120° or 180° to one another.

If there are four pairs of pole pieces, fingers and coils, then there are four vertical planes of symmetry that pass between adjacent pole pieces. In this case four coils can be operated so that there are south poles on the inner faces of four pole pieces on one side of one of the planes of symmetry and north poles on the inner faces of the other four pole pieces on the other side of the plane of symmetry. Since there are four possible vertical planes of symmetry there are accordingly eight possible directions of magnetisation, each at 45° to the next.

Preferably the magnet array is connected to a means for controlling the direction of flow of electric current through the individual energising coils so that the direction of the horizontal magnetic field between the pole pieces can be altered at will.

BRIEF DESCRIPTION OF THE DRAWINGS

In order that the invention may be clearly understood and readily carried into effect two preferred embodiments thereof will now be described, by way of example only, with reference to the accompanying drawings, wherein:—

Referring to FIGS. 1 to 4 of the drawings, and to FIG. 1 in particular, a magnet array 1 comprises a core member 2 in the form of a plate formed with a central aperture 3 and with four symmetrically disposed outwardly projecting fingers 4, 5, 6 and 7 in the form of a cross. Around each of fingers 4, 5, 6 and 7 is positioned a respective coil 8, 9, 10, and 11. Upstanders 12 are affixed to the outer ends of fingers 4, 5, 6, and 7. To the top ends of upstanders 12 are attached magnetic pole pieces 13, 14, 15 and 16. The core member 2, fingers 4, 5, 6, and 7, the upstanders 12, and the pole pieces 13, 14, 15, and 16 are all made from a soft magnetic material.

FIG. 2 illustrates in more detail the shape of the pole pieces 13, 14, 15, and 16. The ends of adjacent pairs of pole pieces (e.g. pole pieces 13 and 14) are typically spaced about 8 mm one from another. Their vertical thickness may be from about 15 mm to about 25 mm, e.g. about 20 mm.

Figure 3:
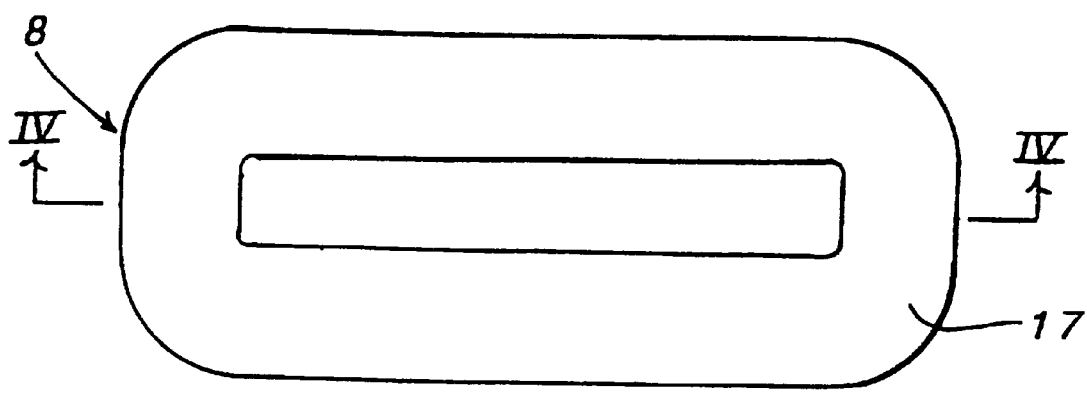
FIG. 3 is a side view of one of the coils used in the magnet array of FIG. 1.
Figure 4:
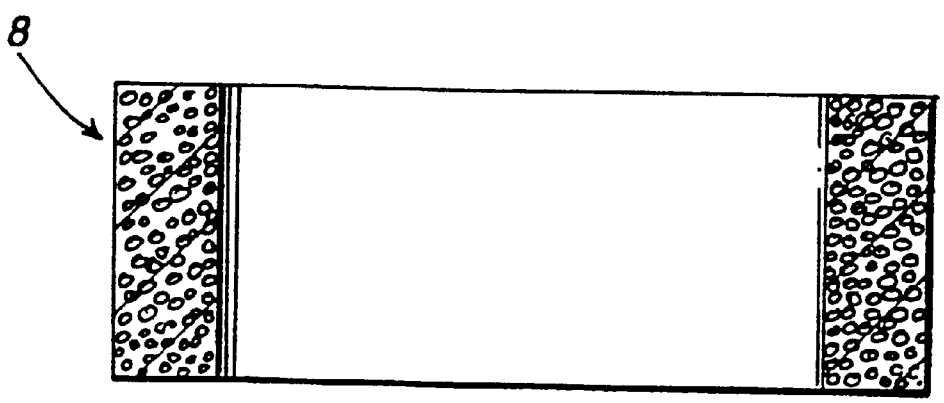
FIG. 4 is a horizontal section on the line IV—IV of FIG. 3.
Figure 5:
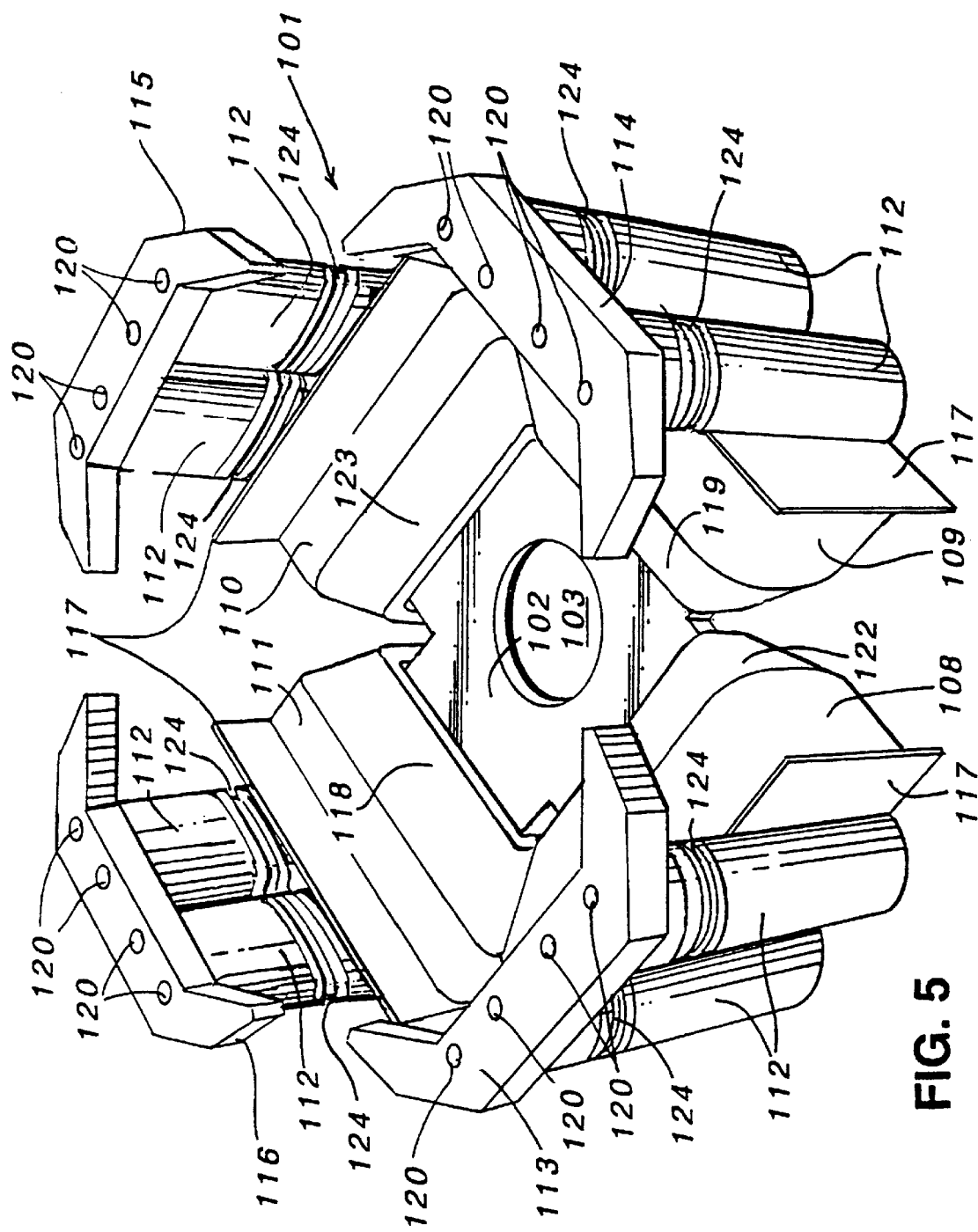
FIG. 5 is a perspective view of a second form of magnet array constructed in accordance with the invention.

As can be seen from FIGS. 3 and 4, the coils, as typified by coil 8, are wound upon a former 17 that fits snugly around the corresponding finger, e.g. finger 4. Each coil may be formed from nominal current 1A 20 SWG (0.9 mm) dual coat polyester cooper wire wound upon former 17 so as to form approximately 15 layers each of 35 turns per layer, making a total of approximately 525 turns, the approximate d.c. resistance of the coil being about 3.5 Ω. Alternatively the coil may be formed from 18 SWG (1.2 mm) dual coat polyester copper wire, in which case about 11 layers each of 26 turns suffice, making a total of 286 turns with an approximate d.c. resistance of 1.07 Ω. After winding the coil 8 is preferably potted in conventional manner. With such coils it is possible to produce a field strength of about 100 Oe (about 7958 amps/metre at the centre of the space between the pole pieces). Of course any other form of winding that produces a field strength of this order of magnitude can be used.

As will be appreciated by those skilled in the art each of coils 8, 9, 10 and 11 will be provided with appropriate electrical connection leads (not shown) to enable them to be connected to a d.c. power supply via a means for controlling the direction of flow of electric current through the individual energising coils 8, 9, 10 and 11 so that the polarity of the pole pieces 13, 14, 15, and 16 can be varied at will.

Figure 1:
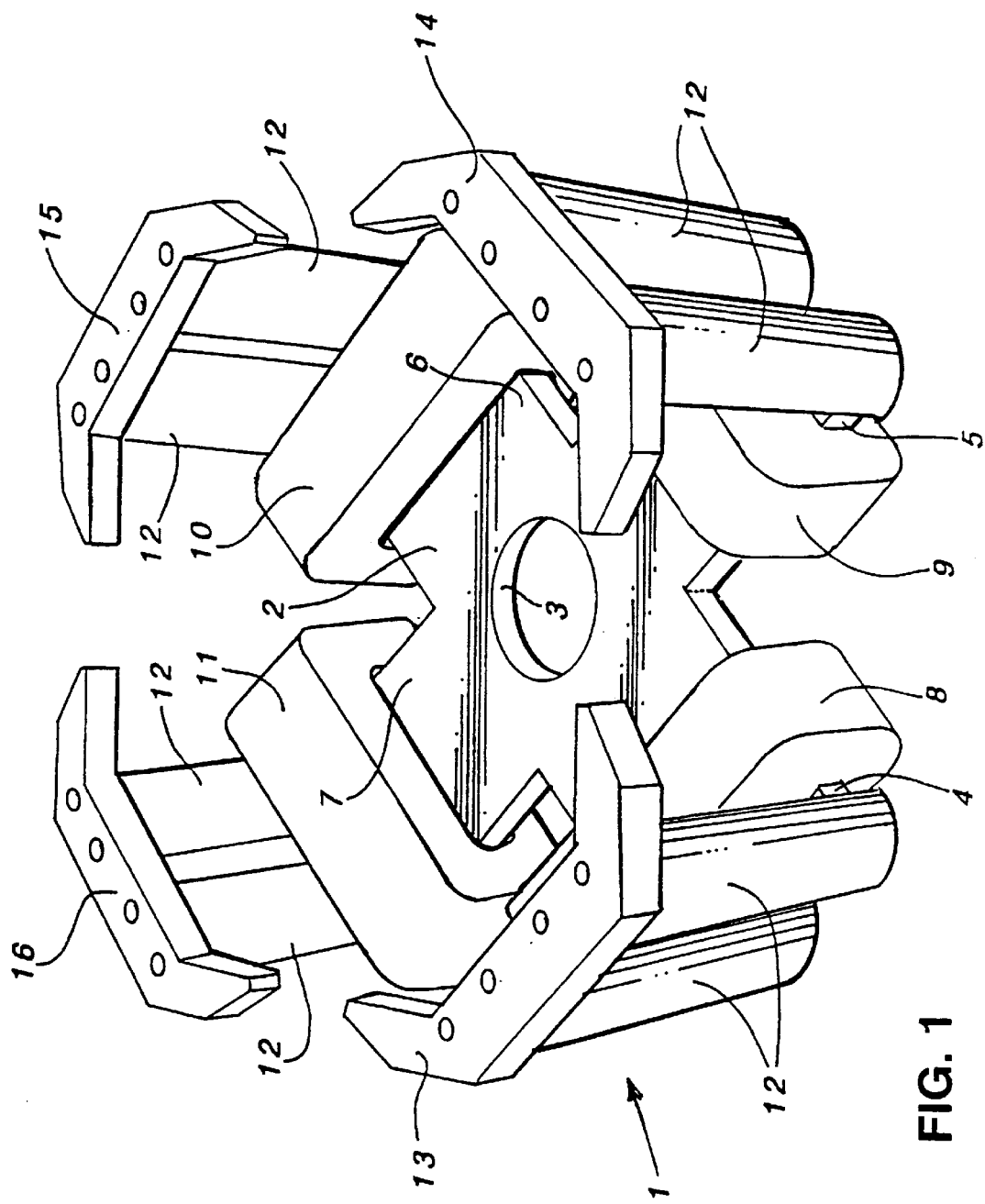
FIG. 1 is a diagrammatic perspective view of a magnet array in accordance with the present invention for use in a sputtering apparatus.
Figure 2:
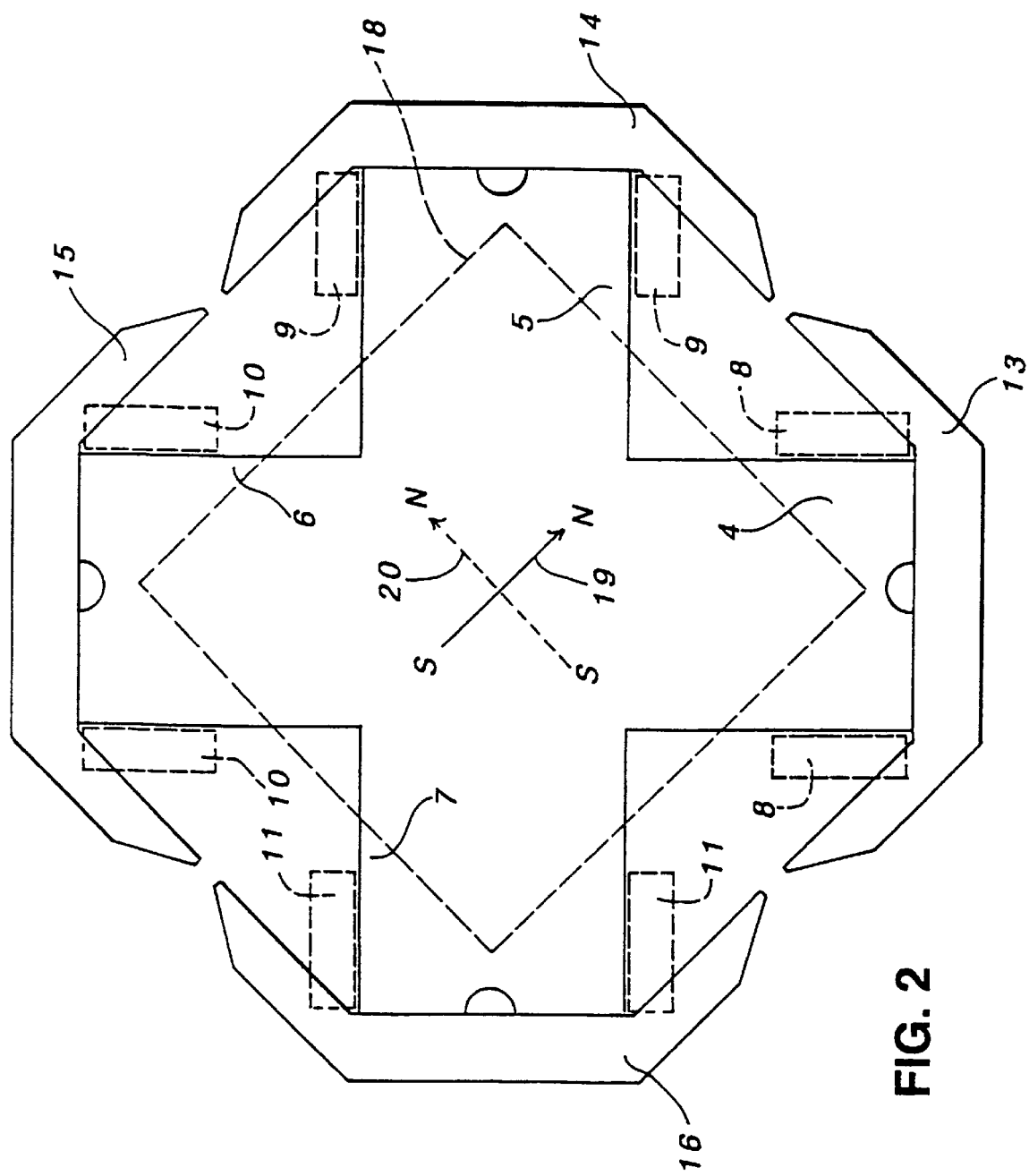
FIG. 2 is a top plan view of the magnet array of FIG. 1.

In use the array 1 is incorporated into a sputtering apparatus (not shown) so that the coils 8, 9, 10 and 11 are external to the vacuum chamber and the upstanders 12 project up from the horizontal projections 3, 4, 5, and 6 through the walls of the vacuum chamber. In this way the pole pieces lie within the vacuum chamber. The aperture 3 may lie adjacent a port in the wall of the vacuum chamber so as to permit the passage of conventional apparatus, such as tongs. A wafer of ceramic material, such as AlTiC, which is indicated at 18 in FIG. 2, is positioned horizontally within the vacuum chamber on a wafer support (not shown) between the four pole pieces 13, 14, 15 and 16 at an appropriate height relative to the pole pieces such that the skew angle is minimised everywhere over the wafer surface, for example at a height from approximately half way up the pole pieces 13, 14, 15 and 16 up to about 50 mm above the pole pieces 13, 14, 15 and 16, such as about 35 mm above the pole pieces 13, 14, 15 and 16. A sputtering electrode is also positioned within the vacuum chamber immediately above the wafer 18. Such a sputtering electrode can be, for example, an r.f. diode or a d.c. magnetron electrode.

If the current in coil 8 and that in coil 9 is caused to flow in a direction to produce a south pole at the respective radially inner faces of the pole pieces 13 and 14 and if the current in coils 10 and 11 is in each case caused to flow in a direction so as to produce a north pole at each of the respective radially inner faces of the pole pieces 15 and 16, then a horizontal magnetic field will be produced as indicated in a full line by arrow 19. Then upon reversing the direction of flow of electric current through coils 8 and 10, but maintaining the original direction of flow of electric current in coils 9 and 11, the magnetic polarities at the radially inner faces of pole pieces 13 and 15 are reversed from their former polarities and a horizontal magnetic field pointing in the direction of the broken arrow 20 will be produced.

In production of a magnetic sensor, for example a spin-valve or GMR sensor, a magnetic field can be maintained in the direction of the arrow 19 during deposition of a first magnetic layer, e.g. a pinned magnetic layer, and then can be switched during deposition of a second layer, for example a free magnetic layer, to the direction of the arrow 20 by switching the direction of flow of electric current through coils 8 and 10.

Since the same pole pieces are used to generate the magnetic fields in the two different directions during deposition of the two types of layer, there is no perturbation of the magnetic field due to the presence of a second set of magnets upon switching the direction of the magnetic field.

In the illustrated magnet array the direction of flow of electric current through the coils is always arranged so that, during operation of the sputtering apparatus, there are always two radially inwardly facing north poles on one side of a vertical plane of symmetry through the array and two radially inwardly facing south poles on the other side of that vertical plane of symmetry. In switching between the two modes of operation described the direction of the magnetic field is changed orthogonally by moving from the direction of arrow 19 to that of arrow 20.

In an alternative arrangement (not shown) the magnetisable core member has six fingers in place of the four fingers of the illustrated embodiment. In this case it is arranged that three pole pieces have radially inwardly facing south poles on one side of a vertical plane of symmetry through the array and three pole pieces have radially inwardly facing north poles on the opposite side of that vertical plane of symmetry. In this case there are six possible modes of operation, each giving rise to a magnetic field whose direction can be symbolised by an arrow orientated at 60°, 120° or 180° to each of the other arrows.

Similarly it will be readily apparent that if a core member with eight fingers is used, then eight possible modes of operation can be achieved, each producing a horizontal magnetic field whose direction as symbolised by an arrow whose direction lies at 45° to at least one other corresponding arrow.

The construction of the magnet array 101 of FIGS. 5 to 8 is very similar to that of magnet array 1 of FIGS. 1 to 4, except that the winding of the coils is different. Thus magnet array 101 comprises a core member 102 in the form of a plate formed with a central aperture 103 and with four symmetrically disposed outwardly projecting fingers 104, 105, 106 and 107 in the form of a cross. Around each of fingers 104, 105, 106 and 107 is positioned a respective coil 108, 109, 110, and 111. Upstanders 112 are affixed to the outer ends of fingers 104, 105, 106, and 107. To the top ends of upstanders 112 are attached magnetic pole pieces 113, 114, 115 and 116. The core member 102, fingers 104, 105, 106, and 107, the upstanders 112, and the pole pieces 113, 114, 115, and 116 are all made from a soft magnetic material.

Figure 6:
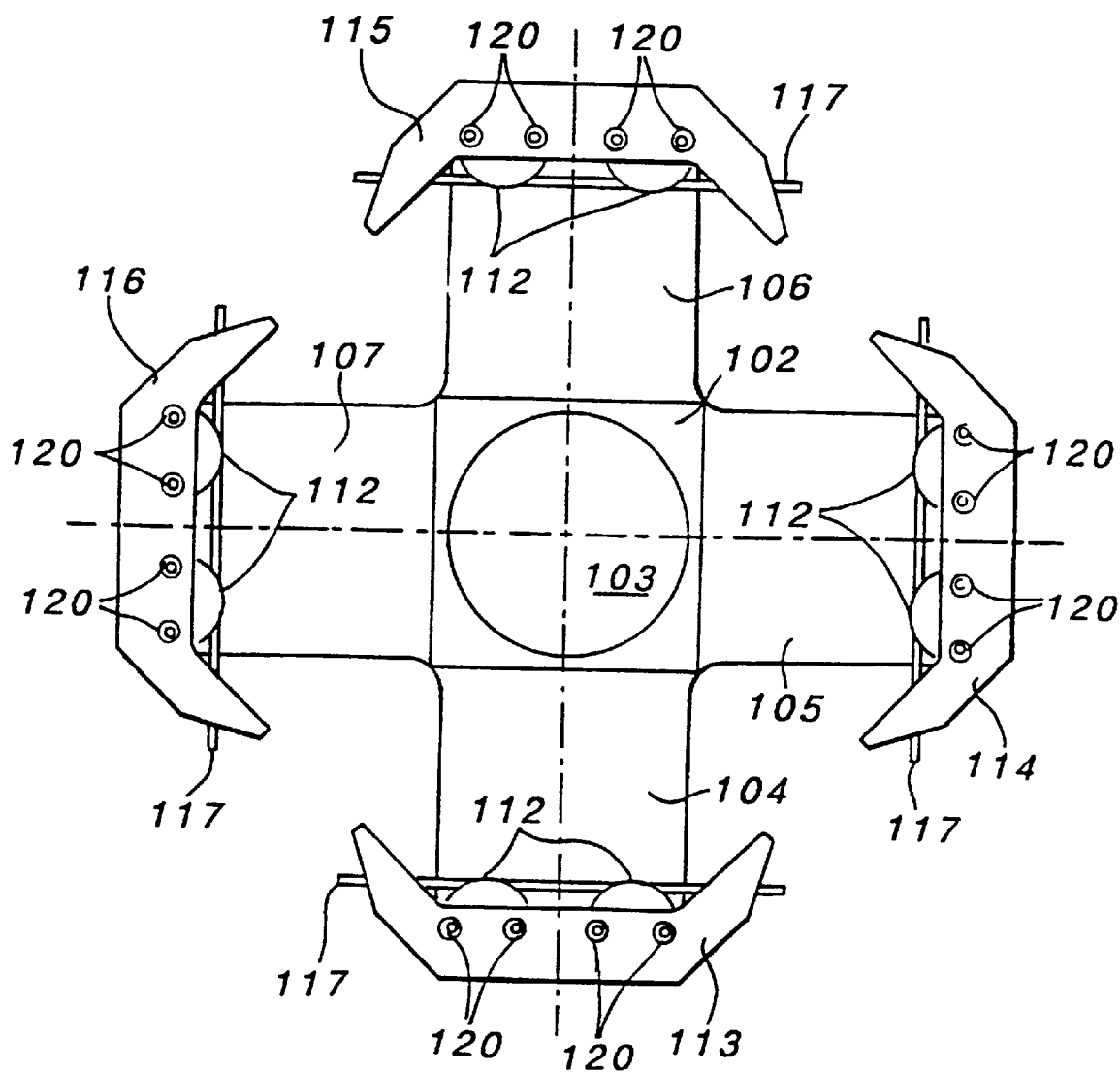
FIG. 6 is a top plan view of the array of FIG. 5.
Figure 7:
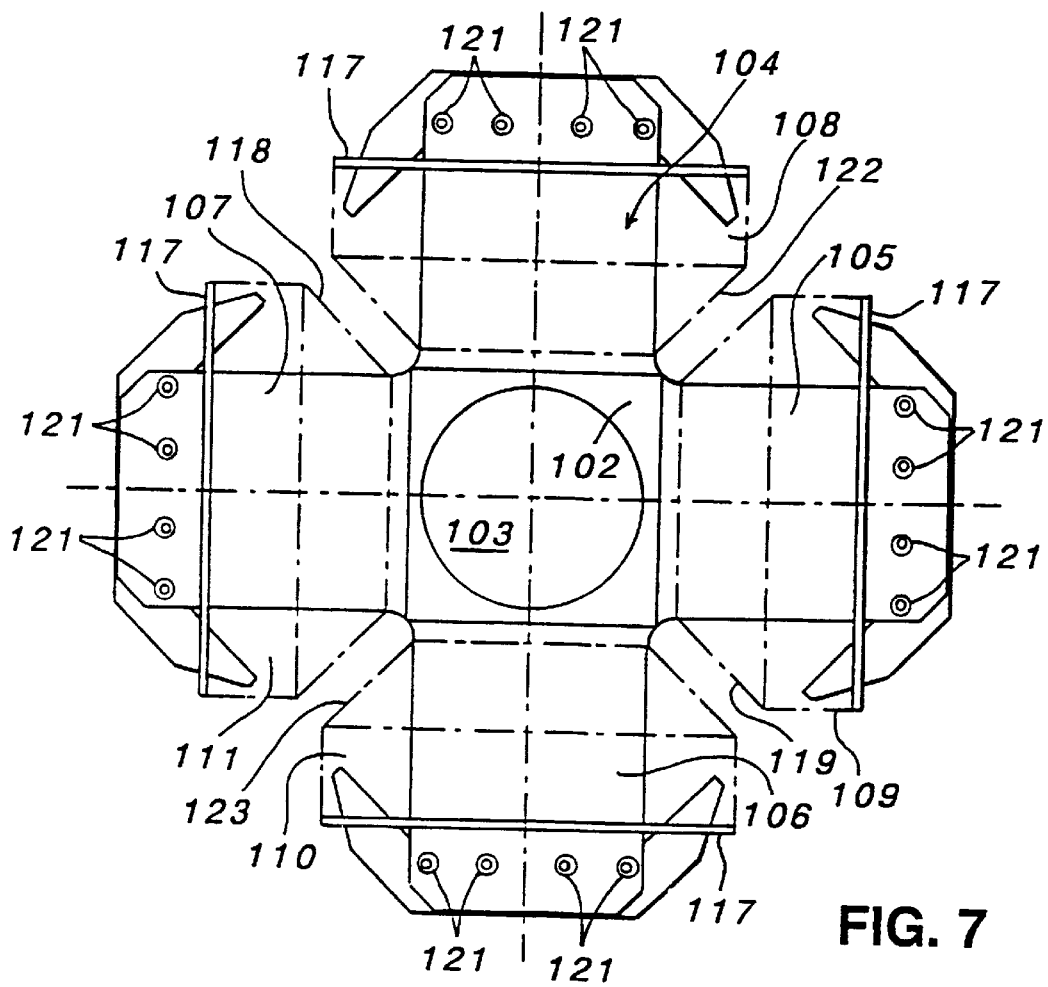
FIG. 7 is a bottom plan view of the array of FIGS. 5 and 6 before winding of the coils.

FIG. 6 illustrates in more detail the shape of the pole pieces 113, 114, 115, and 116.

The coils 108, 109, 110 and 111 are each wound upon a corresponding former (not shown) that fits snugly around the corresponding finger 104, 105, 106 or 107. Each coil may be formed from similar copper wire to that used for coils 8, 9, 10 and 11 of the magnet array 1 of FIGS. 1 to 4. A backing plate 117 is provided to stabilise mechanically each of coils 108, 109, 110 and 111. As can be seen from FIG. 8 each of coils 108, 109, 110 and 111 has more turns of wire adjacent its respective backing plate 117 than near hole 103. Thus coil 111 tapers towards its inner end adjacent hole 103 as indicated by reference numeral 118 in FIG. 8. Likewise coil 109 tapers towards its inner end as shown by reference numeral 119 in FIG. 8.

Figure 8:
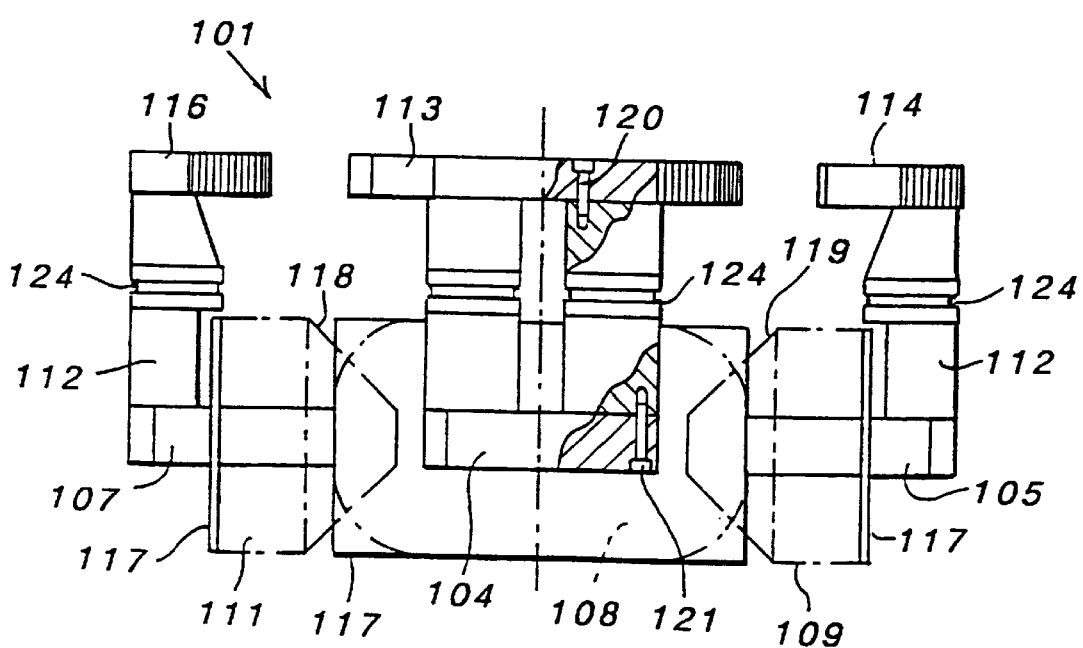
FIG. 8 is a side view (partly in section) of the magnet array of FIGS. 5 to 7.

Pole piece 113 is retained in place by screws 120, only one of which is shown in FIG. 8. Likewise upstanders 112 are fixed in place by means of screws 121, of which only one is shown in FIG. 8. Reference numeral 122 in FIG. 7 indicates the taper at the inner end of coil 104, while reference numeral 123 indicates the corresponding taper on coil 110.

Part way up each upstander 112 there is a groove 124 which receives an O-ring (not shown) for the purpose of providing a vacuum-tight seal with the wall of the vacuum chamber of a vacuum sputtering apparatus when the magnet array 101 is positioned in the vacuum sputtering apparatus. In this case pole pieces 113, 114, 115, 116 and 117 are inside the vacuum chamber inside which the plasma is to be generated for vacuum sputtering while the coils 104, 105, 106 and 107 are outside the vacuum chamber.

The mode of operation of the magnet array 101 of FIGS. 5 to 8 is similar to that of the magnet array 1. In use of the magnet array 101 the wafer (not shown) is positioned in a similar position in relation to the pole pieces 113, 114, 115 and 116 to that described for wafer 18 in relation to the pole pieces 13, 14, 15 and 16 of the magnet array 1 of FIGS. 1 to 4.

What is claimed is:

1. An electro-magnet array for use in a sputtering apparatus comprising:

a magnetisable core member extending substantially horizontally and having magnetisable outward projections arranged as at least two pairs of symmetrically opposed projections projecting outwardly and radially symmetrically from the magnetisable core member;

a pole piece associated with each projection and vertically displaced with respect thereto;

magnetisable coupling means arranged to couple each pole piece magnetically to its respective projection; and a magnetising coil around each projection arranged for producing a magnetic field aligned substantially with a horizontal axis of symmetry of its respective projection in dependence upon the direction of flow of electric current through the magnetising coil;

the magnetising coils being arranged so that, upon energisation, the respective magnetic field of one coil of a pair of projections can produce a south pole at an inward side of its respective pole piece while the magnetic field of the coil of the other projection of the pair produces a north pole at an inward side of its respective pole piece and so that, at any moment, at least two inwardly facing south poles are produced on the pole pieces on one side of a vertical place of symmetry through the array and an equal number of inwardly facing north poles are produced on the pole pieces on the other side of the vertical plane of symmetry, the vertical plane of symmetry passing between adjacent pole pieces.

2. An electro-magnet array according to claim 1 wherein there are four magnetisable projections on the magnetisable core member arranged in two pairs.

3. An electro-magnet array according to claim 1 wherein the magnetisable projections extend horizontally from the core member.

4. An electro-magnet array according to claim 1 wherein the magnetisable core member is formed from a plate and the projections are integral therewith.

5. An electro-magnet array according to claim 1 wherein the core member is substantially square in outline and the projections are also substantially square or rectangular in outline so that the core member and its four projections form a cross.

6. An electro-magnet according to claim 1 further comprising a central aperture formed in the magnetisable core member.

7. An electro-magnet array according to claim 1 wherein the magnetisable core member and its projections are made from a soft magnetisable material selected from soft iron, mild steel, and soft magnetic alloys.

8. An electro-magnet according to claim 1 wherein the pole pieces are identical one to another and are displaced by the same vertical distance from the magnetisable core member and its projections.

9. An electro-magnet array according to claim 1 wherein the magnetisable coupling means comprises a member or members of a soft magnetisable material selected from soft iron, mild steel, and soft magnetic alloys.

10. An electro-magnet array according to claim 1 wherein the pole pieces are made from a soft magnetic material selected from soft iron, mild steel, and soft magnetic alloys.

11. An electro-magnet array according to claim 1 further comprising means for controlling the direction of flow of electric current through the individual magnetising coils so that the direction of the horizontal magnetic field between the pole pieces can be altered at will.

12. An electro-magnet according to claim 1 wherein the coils include a tapered portion at their inner ends.

13. A vacuum sputtering apparatus provided with at least one electro-magnet array according to claim 1.

14. An electro-magnet array for use in a sputtering apparatus comprising:

a magnetisable core member extending substantially horizontally and having magnetisable outward projections arranged as at least two pairs of symmetrically opposed projections projecting outwardly and radially symmetrically from the magnetisable core member whereby there are at least two vertical planes of symmetry through the magnetisable core member;

a pole piece associated with each projection and vertically displaced with respect thereto, the pole pieces being disposed so that adjacent pole pieces lie on opposite sides of a respective vertical plane of symmetry;

magnetisable coupling means arranged to couple each pole piece magnetically to its respective projection; and a magnetising coil around each projection arranged for producing a magnetic field aligned substantially with a horizontal axis of symmetry of its respective projection in dependence upon the direction of flow of electric current through the magnetising coil;

the magnetising coils being arranged so that, upon energisation, the respective magnetic field of one coil of a pair of projections can produce a south pole at an inward side of its respective pole piece while the magnetic field of the coil of the other projection of the pair produces a north pole at an inward side of its respective pole piece, so that, at any moment, at least two inwardly facing south poles are produced on the pole pieces on one side of a first one of the vertical planes of symmetry through the array and an equal number of inwardly facing north poles are produced on the pole pieces on the other side of the first one of the vertical planes of symmetry, with south poles only on one side of the first one of the planes of symmetry and with north poles only on the other side thereof, and so that, upon altering the direction of flow of electric current through the magnetising coils around the projections of one of the opposed pair of projections, the polarities of the respective pole pieces of that one pair of projections are reversed and the inwardly facing south poles and north poles now lie on opposite sides of a second one of the vertical planes of symmetry with south poles only on one side of the second one of the vertical planes of symmetry and north poles only on the other side thereof.

15. An electro-magnet array according to claim 14, in which there are four magnetisable projections on the magnetisable core member arranged in two pairs.

16. An electro-magnet array according to claim 14, in which the magnetisable projections extend horizontally from the core member.

17. An electro-magnet array according to claim 14, in which the magnetisable core member is formed from a plate and the projections are integral therewith.

18. An electro-magnet array according to claim 14, in which the core member is substantially square in outline and the projections are also substantially square or rectangular in outline so that the core member and its four projections form a cross.

19. An electro-magnet array according to claim 14, in which a central aperture is formed in the magnetisable core member.

20. An electro-magnet array according to claim 14, in which the magnetisable core member and its projections are made from a soft magnetisable material selected from soft iron, mild steel, and soft magnetic alloys.

21. An electro-magnet array according to claim 14, in which the pole pieces are identical one to another and are displaced by the same vertical distance from the magnetisable core member and its projections.

22. An electro-magnet array according to claim 14, in which the magnetisable coupling means comprises a member or members of a soft magnetisable material selected from soft iron, mild steel, and soft magnetic alloys.

23. An electro-magnet array according to claim 14, in which the pole pieces are made from a soft magnetic material selected from soft iron, mild steel, and soft magnetic alloys.

24. An electro-magnet array according to claim 14, in which the magnet array is connected to a means for controlling the direction of flow of electric current through the individual magnetising coils so that the direction of the horizontal magnetic field between the pole pieces can be altered at will.

25. An electro-magnet array according to claim 14, in which the windings of the coils include a tapered portion at their inner ends.

26. A vacuum sputtering apparatus provided with at least one electro-magnet array according to claim 14.

27. An electro-magnet array for use in a sputtering apparatus comprising:
  a magnetisable core member extending substantially horizontally and having four magnetisable outward projections arranged as two pairs of symmetrically opposed projections projecting outwardly and radially symmetrically from the magnetisable core member whereby there are two vertical planes of symmetry through the magnetisable core member;
  a pole piece associated with each projection and vertically displaced with respect thereto, the pole pieces being disposed so that adjacent pole pieces lie on opposite sides of a respective vertical plane of symmetry;
  magnetisable coupling means arranged to couple each pole piece magnetically to its respective projection; and
  a magnetising coil around each projection arranged for producing a magnetic field aligned substantially with a horizontal axis of symmetry of its respective projection in dependence upon the direction of flow of electric current through the magnetising coil;
  the magnetising coils being arranged so that, upon energisation, the respective magnetic field of one coil of a pair of projections can produce a south pole at an inward side of its respective pole piece while the magnetic field of the coil of the other projection of the pair produces a north pole at an inward side of its respective pole piece, so that, at any moment, two inwardly facing south poles are produced on the pole pieces on one side of a first one of the vertical planes of symmetry through the array and an equal number of inwardly facing north poles are produced on the pole pieces on the other side of the first one of the vertical planes of symmetry, and so that, upon altering the direction of flow of electric current through the magnetising coils around the projections of one of the opposed pair of projections, the polarities of the respective pole pieces of that one pair of projections are reversed and the inwardly facing south poles and north poles now lie on opposite sides of a second one of the vertical planes of symmetry.

28. An electro-magnet array according to claim 27, in which the magnetisable projections extend horizontally from the core member.

29. An electro-magnet array according to claim 27, in which the magnetisable core member is formed from a plate and the projections are integral therewith.

30. An electro-magnet array according to claim 27, in which the core member is substantially square in outline and the projections are also substantially square or rectangular in outline so that the core member and its four projections form a cross.

31. An electro-magnet array according to claim 27, in which a central aperture is formed in the magnetisable core member.

32. An electro-magnet array according to claim 27, in which the magnetisable core member and its projections are made from a soft magnetisable material selected from soft iron, mild steel, and soft magnetic alloys.

33. An electro-magnet according to claim 27, in which the pole pieces are identical one to another and are displaced by the same vertical distance from the magnetisable core member and its projections.

34. An electro-magnet array according to claim 27, in which the magnetisable coupling means comprises a member or members of a soft magnetisable material selected from soft iron, mild steel, and soft magnetic alloys.

35. An electro-magnet array according to claim 27, in which the pole pieces are made from a soft magnetic material selected from soft iron, mild steel, and soft magnetic alloys.

36. An electro-magnet array according to claim 27, in which the magnet array is connected to a means for controlling the direction of flow of electric current through the individual magnetising coils so that the direction of the horizontal magnetic field between the pole pieces can be altered at will.

37. An electro-magnet array according to claim 27, in which the windings of the coils include a tapered portion at their inner ends.

38. A vacuum sputtering apparatus provided with at least one electro-magnet array according to claim 27.

* * * * *